US012598703B2

(12) United States Patent (10) Patent No.: US 12,598,703 B2
Shibata et al. (45) Date of Patent: Apr. 7, 2026

(54) WIRING CIRCUIT BOARD

(71) Applicant: NITTO DENKO CORPORATION,
Osaka (JP)

(72) Inventors: Shusaku Shibata, Osaka (JP);
Takahiro Ikeda, Osaka (JP); **Teppei
Niino**, Osaka (JP)

(73) Assignee: NITTO DENKO CORPORATION,
Osaka (JP)

( * ) Notice: Subject to any disclaimer, the term of this
patent is extended or adjusted under 35
U.S.C. 154(b) by 177 days.

(21) Appl. No.: 18/253,892

(22) PCT Filed: Oct. 29, 2021

(86) PCT No.: PCT/JP2021/040012
§ 371 (c)(1),
(2) Date: May 22, 2023

(87) PCT Pub. No.: WO2022/113649
PCT Pub. Date: Jun. 2, 2022

(65) Prior Publication Data
US 2024/0008178 A1 Jan. 4, 2024

(30) Foreign Application Priority Data

Nov. 25, 2020 (JP) ................................. 2020-195465

(51) Int. Cl.
*H05K 1/11* (2006.01)
*H05K 3/44* (2006.01)
(Continued)

(52) U.S. Cl.
CPC .............. *H05K 1/113* (2013.01); *H05K 3/44*
(2013.01); *H05K 1/056* (2013.01); *H05K
3/108* (2013.01);
(Continued)

(58) Field of Classification Search
CPC ................... H05K 1/113; H05K 1/112; H05K
2201/09481; H05K 2201/09609; H05K
2201/0979
See application file for complete search history.

(56) References Cited

U.S. PATENT DOCUMENTS

2002/0074161 A1* 6/2002 Jensen ................... H05K 1/114
174/262
2005/0282088 A1 12/2005 Aonuma et al.
(Continued)

FOREIGN PATENT DOCUMENTS

JP 2004-228446 A 8/2004
JP 2006-012205 A 1/2006
(Continued)

OTHER PUBLICATIONS

Office Action, issued by the Japanese Patent Offfice on Jan. 23,
2024, in connection with Japanese Patent Application No. 2022-
182212.
(Continued)

*Primary Examiner* — Jeremy C Norris
(74) *Attorney, Agent, or Firm* — Edwards Neils LLC;
Jean C. Edwards, Esq.

(57) ABSTRACT

A wiring circuit board includes a metal supporting board; an
insulating layer; and a conductive layer in this order in a
thickness direction. The conductive layer includes a terminal
portion, and a tail line portion extending from the terminal
portion. The terminal portion has a via portion that pen-
etrates the insulating layer in the thickness direction and is
connected to the metal supporting board. The tail line
portion has a base end portion that has a width different from
a width of the terminal portion in a direction orthogonal to
the extending direction of the tail line portion and that is
connected with the terminal portion; and a second via
(Continued)

portion that penetrates the insulating layer in the thickness direction and that is connected to the metal supporting board.

7 Claims, 12 Drawing Sheets

(51) Int. Cl.
  *H05K 1/05* (2006.01)
  *H05K 3/10* (2006.01)
(52) U.S. Cl.
  CPC ................ *H05K 2201/0338* (2013.01); *H05K 2201/09481* (2013.01); *H05K 2201/09554* (2013.01); *H05K 2201/09609* (2013.01); *H05K 2201/09618* (2013.01); *H05K 2201/0979* (2013.01); *H05K 2203/0723* (2013.01)

(56) References Cited

U.S. PATENT DOCUMENTS

| | | | |
|---|---|---|---|
| 2007/0074899 A1 | 4/2007 | Aonuma et al. | |
| 2017/0019985 A1 | 1/2017 | Sugimoto et al. | |
| 2019/0182949 A1* | 6/2019 | Misawa | .................. H05K 1/118 |
| 2019/0306993 A1* | 10/2019 | Kim | ......................... B32B 15/20 |
| 2022/0007507 A1 | 1/2022 | Fukushima et al. | |

FOREIGN PATENT DOCUMENTS

| | | | |
|---|---|---|---|
| JP | 2007-058967 A | 3/2007 |
| JP | 2009-004096 A | 1/2009 |
| JP | 2010-050251 A | 3/2010 |
| JP | 2014-157641 A | 8/2014 |
| JP | 2016-018577 A | 2/2016 |
| JP | 2017-021878 A | 1/2017 |
| TW | 202031104 A | 8/2020 |

OTHER PUBLICATIONS

International Search Report issued in PCT/JP2021/040012 on Dec. 28, 2021.
Written Opinion issued in PCT/JP2021/040012 on Dec. 28, 2021.
Notification of Reasons for Refusal issued on Sep. 13, 2022 in Japanese Patent Application No. 2020-195465.
International Preliminary Report on Patentability issued by WIPO on May 30, 2023, in connection with International Patent Application No. PCT/JP2021/040012.
Office Action issued by Taiwan Intellectual Property Office on Jun. 5, 2025, in connection with Taiwanese Patent Application No. 110141332.
Office Action, issued by the Korean Intellectual Property Office on Aug. 18, 2025, in connection with Korean Patent Application No. 10-2023-7016867.
Office Action which was issued by the Intellectual Property Office of Vietnam on Nov. 6, 2025, in connection with Vietnamese Patent Application No. 1-2023-03271.

* cited by examiner

FIG. 6

WIRING CIRCUIT BOARD

CROSS-REFERENCE TO RELATED APPLICATIONS

The present application is a 35 U.S.C. 371 National Stage Entry of PCT/JP2021/040012, filed on Oct. 29, 2021, which claims priority from Japanese Patent Application No. 2020-195465, filed on Nov. 25, 2020, the contents of all of which are herein incorporated by reference in their entirety.

TECHNICAL FIELD

The present invention relates to a wiring circuit board.

BACKGROUND ART

There has been known a wiring circuit board including a metal supporting board, an insulating layer on the metal supporting board, and a wiring pattern on the insulating layer. The wiring circuit board is provided with, for example, a ground terminal that has a pad-on-via structure to be electrically connected to the metal supporting board from the viewpoint of achieving high-density wiring. Such a wiring circuit board is disclosed in, for example, Patent Document 1 below.

CITATION LIST

Patent Document

Patent Document 1: Japanese Unexamined Patent Publication No. 2014-157641

SUMMARY OF THE INVENTION

Problem to be Solved by the Invention

The wiring circuit board disclosed in Patent Document 1 has a metal supporting board 1, an insulating layer 2, and a terminal portion 3 as shown in FIG. 15. The insulating layer 2 has an opening 2a that penetrates the insulating layer 2 in the thickness direction. The terminal portion 3 includes a pad portion 4 disposed on the insulating layer 2, and a via portion 5 that is disposed in the opening 2a and that is connected to the metal supporting board 1 (the pad portion 4 and the via portion 5 are contiguous). That is, the terminal portion 3 has a pad-on-via structure to be electrically connected to the metal supporting board 1 and functions as a ground terminal. This terminal portion 3 is formed, for example, by forming a film of a conductive material on the insulating layer 2 having the opening 2a and then patterning the film.

In this wiring circuit board, in order to reduce the resistance of a ground connection at the terminal portion 3, for example, it is necessary to increase the diameter of the via portion 5 (via hole diameter). The terminal portion 3, however, has a recess 3a in the exposed surface. The larger the via hole diameter is, the larger the recess 3a becomes. In a case of bonding a solder bump 6 as a terminal of an external component onto the terminal portion 3, the larger the recess 3a is, the more likely a gap G (void) is to be formed between the terminal portion 3 and the solder bump 6. The formation of the gap G causes connection failure between the terminal portion 3 and the solder bump 6, which is not preferable.

The present invention provides a wiring circuit board suitable for increasing wiring density, and is suitable for achieving good connectivity to an external component terminal and a low-resistance ground connection in a terminal portion.

Means for Solving the Problem

The present invention [1] includes a wiring circuit board, including a metal supporting board; an insulating layer; and a conductive layer in this order in a thickness direction, in which the conductive layer includes a terminal portion, and a tail line portion that extending from the terminal portion, the terminal portion having a first via portion that penetrates the insulating layer in the thickness direction and is connected to the metal supporting board, the tail line portion having a base end portion and a second via portion, the base end portion having a width different from a width of the terminal portion in a direction orthogonal to the extending direction of the tail line portion, the base end portion being connected to the terminal portion, the second via portion penetrating the insulating layer in the thickness direction and being connected to the metal supporting board.

In the wiring circuit board of the present invention, as described above, the terminal portion has the first via portion that is connected to the metal supporting board, and the tail line portion extends from this terminal portion and has the second via portion that is connected to the metal supporting board. That is, in the wiring circuit board, the terminal portion having a via-on-pad (VOP) structure, in addition to being electrically connected to the metal supporting board through the first via portion inside the VOP structure, is electrically connected to the metal supporting board through the second via portion outside the VOP structure. This configuration is suitable for resistance reduction in electrical connection between the terminal portion and the metal supporting board while suppressing enlargement of diameters of the first and second via portions.

The above-described configuration, in which the terminal portion has a VOP structure and is suitable for suppressing the enlargement of the diameter of the second via portion, is suitable for securing a wiring formable region in the wiring circuit board, and is therefore suitable for achieving high-density wiring. The above-described configuration suitable for suppressing the enlargement of the diameter of the first via portion is suitable for suppressing the enlargement of a diameter of a recess in an exposed surface of the terminal portion, and is therefore suitable for securing good connectivity of the terminal portion to an external component terminal. The above-described configuration suitable for reducing the resistance of the electrical connection between the terminal portion and the metal supporting board is suitable for achieving a low-resistance ground connection through the metal supporting board in the terminal portion.

The present invention [2] includes the wiring circuit board described in [1], in which a connection area of the second via portion to the metal supporting board is larger than a connection area of the first via portion to the metal supporting board.

This wiring circuit board is suitable for reducing the resistance of the electrical connection between the terminal portion and the metal supporting board while suppressing the enlargement of the diameter of the first via portion.

The present invention [3] includes the wiring circuit board described in [1] or [2], in which the tail line portion has a plurality of the second via portions.

This wiring circuit board is suitable for reducing the resistance of the electrical connection between the terminal portion and the metal supporting board while suppressing the enlargement of the diameters of the first and second via portions.

The present invention [4] includes the wiring circuit board described in [3], in which a total connection area of the plurality of second via portions to the metal supporting board is larger than a connection area of the first via portion to the metal supporting board.

This wiring circuit board is suitable for reducing the resistance of the electrical connection between the terminal portion and the metal supporting board while suppressing the enlargement of the diameter of the first via portion.

The present invention [5] includes the wiring circuit board described in any one of the above-described [1] to [4], in which the terminal portion includes a first conductive layer on a side of the insulating layer, and a second conductive layer on the first conductive layer.

It is preferable for the terminal portion to have a two-layer structure from the viewpoint of securing the strength of the terminal portion. It is also preferable for the terminal portion to have the two-layer structure from the viewpoint of securing good connectivity of the terminal portion by suppressing the size of the recess in the surface of the terminal portion.

The present invention [6] includes the wiring circuit board described in any one of the above-described [1] to [5], in which the conductive layer includes two terminal portions, and the tail line portion extends from one terminal portion to the other terminal portion.

This configuration (configuration in which the two terminal portions share the tail line portion that extends from each of the terminal portions) is suitable for securing a wiring formable region in the wiring circuit board, and is therefore suitable for achieving high-density wiring.

BRIEF DESCRIPTION OF THE DRAWINGS

FIG. 3A represents a preparation step, FIG. 3B represents a base insulating layer forming step, FIG. 3C represents a conductive layer forming step, and FIG. 3D represents a cover insulating layer forming step.

FIG. 6 is a fragmentary plan view of another modification of the wiring circuit board of the first embodiment. In this modification, a pattern shape of the tail line portion is different from that of the first embodiment.

FIG. 12A represents a first conductive layer forming step, FIG. 12B represents a second conductive layer forming step, and FIG. 12C represents a cover insulating layer forming step.

DESCRIPTION OF THE EMBODIMENTS

Figure 1:
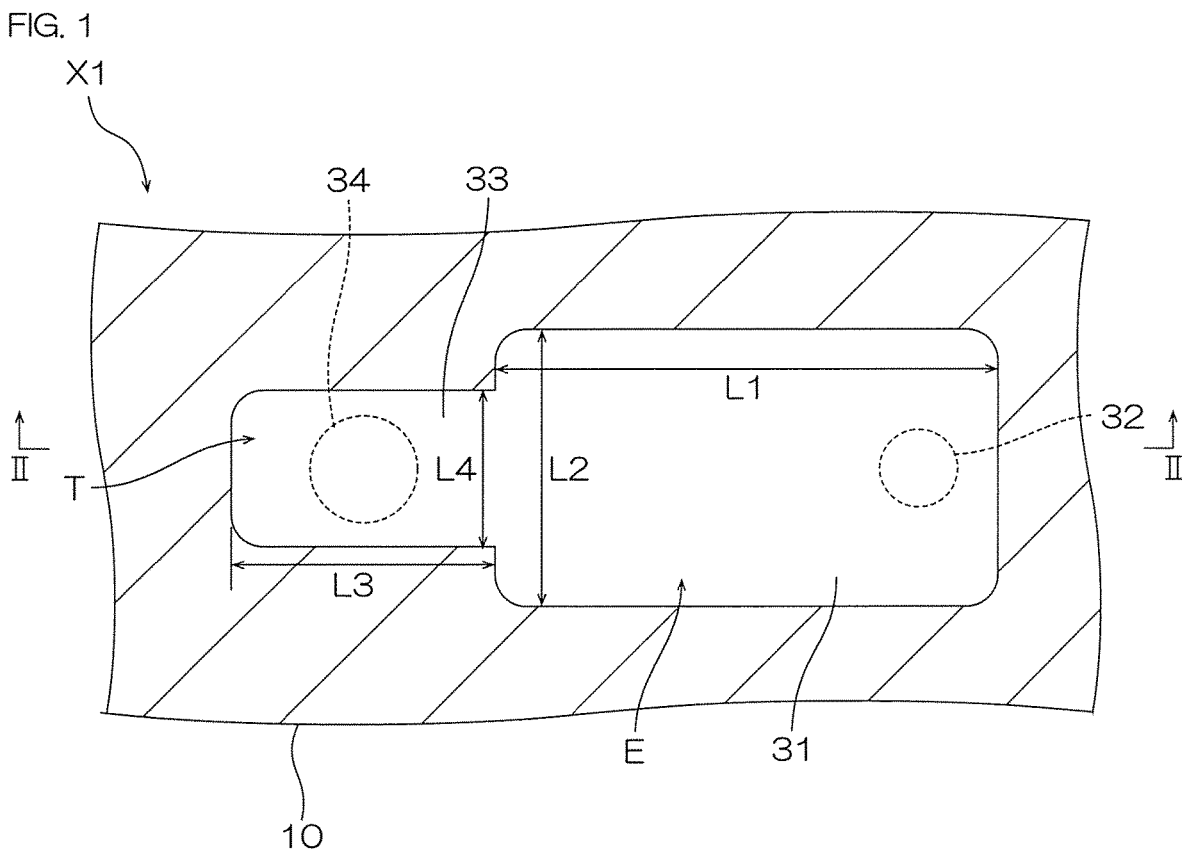
FIG. 1 is a fragmentary plan view of a first embodiment of a wiring circuit board of the present invention.
Figure 2:
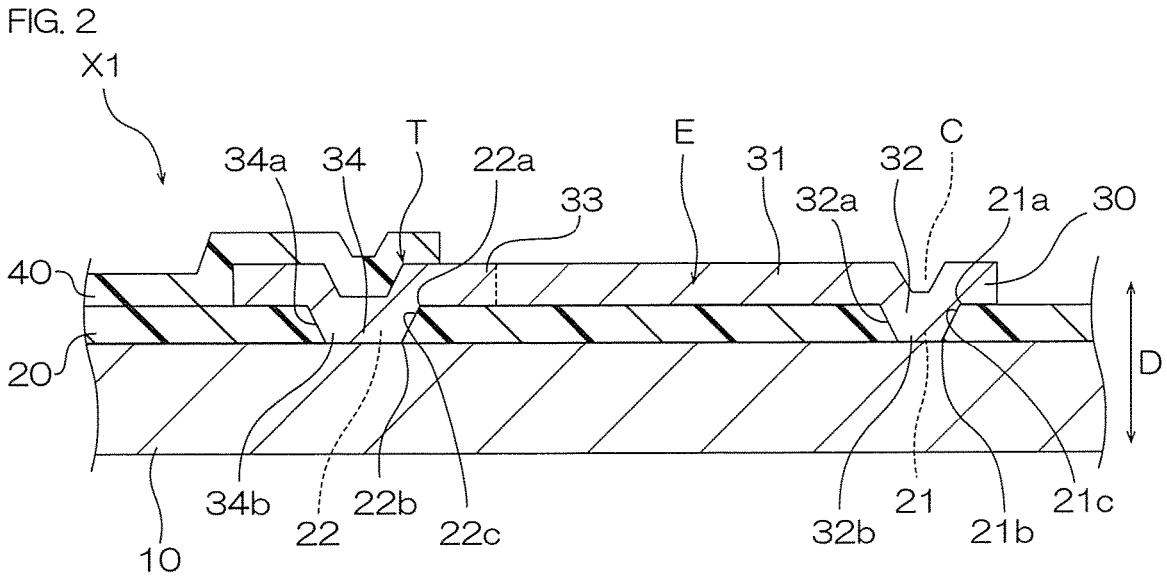
FIG. 2 is a cross sectional view taken along line II-II in FIG. 1.

As shown in FIGS. 1 and 2, a wiring circuit board X1, which is a first embodiment of the wiring circuit board of the present invention, includes a metal supporting board 10, an insulating layer 20 as a base insulating layer, a conductive layer 30, and an insulating layer 40 (not illustrated in FIG. 1) as a cover insulating layer in this order toward one side in a thickness direction D. The wiring circuit board X1 extends in a direction (plane direction) orthogonal to the thickness direction D and has a predetermined shape in plan view.

The metal supporting layer 10 is a substrate for securing the strength of the wiring circuit board X1. Examples of a material of the metal supporting board 10 include stainless steel, copper, copper alloy, aluminum, nickel, titanium, and 42 alloy. Examples of the stainless steel include SUS304 according to the AISI (American Iron and Steel Institute) standard. From the viewpoint of the strength of the metal supporting board 10, the metal supporting layer 10 preferably contains at least one selected from the group consisting of stainless steel, copper alloy, aluminum, nickel, and titanium, and is more preferably formed of at least one selected from the group consisting of stainless steel, copper alloy, aluminum, nickel, and titanium. The metal supporting board 10 is preferably formed of copper alloy from the viewpoint of achieving both the strength and conductivity of the metal supporting board 10. The metal supporting board 10 has a thickness of, for example, 15 μm or more. The thickness of the metal supporting board 10 is, for example, 500 μm or less, preferably 250 μm or less.

The insulating layer 20 is disposed on one side in the thickness direction D of the metal supporting board 10. In this embodiment, the insulating layer 20 is disposed on one surface in the thickness direction D of the metal supporting board 10. Examples of a material of the insulating layer 20 include resin materials such as polyimide, polyether nitrile, polyethersulfone, polyethylene terephthalate, polyethylene naphthalate, and polyvinyl chloride (the same resin materials are also used for a material of the insulating layer 40 to be described later). The insulating layer 20 has a thickness of preferably 1 μm or more, more preferably 3 μm or more.

The thickness of the insulating layer 20 is preferably 35 μm or less, more preferably 15 μm or less.

The insulating layer 20 has openings 21 and 22 that penetrate the insulating layer 20 in the thickness direction D. The openings 21, 22 are disposed between the metal supporting board 10 and the conductive layer 30. The openings 21, 22 are disposed at an interval from each other in a longitudinal direction of the conductive layer 30 (specifically, in a longitudinal direction of a pad portion 31 to be described later).

The opening 21 has, for example, a generally circular shape in plan view. The opening 21 has an opening end 21a on one side in the thickness direction D, and an opening end 21b on the other side in the thickness direction D. The opening 21 has an inner wall surface 21c between the opening ends 21a and 21b. In this embodiment, the inner wall surface 21c is inclined so that a portion thereof closer to the metal supporting board 10 is disposed inwardly. That is, the inner wall surface 21c is inclined so that the opening cross-sectional area of the opening 21 becomes smaller as the portion comes closer to the metal supporting board 10. On the opening end 21b side, the opening 21 has an opening diameter of, for example, 10 to 200 μm according to the diameter of a via portion 32 to be described later.

The opening 22 has, for example, a generally circular shape in plan view. The opening 22 has an opening end 22a on one side in the thickness direction D, and an opening end 22b on the other side in the thickness direction D. The opening 22 has an inner wall surface 22c between the opening ends 22a and 22b. In this embodiment, the inner wall surface 22c is inclined so that a portion thereof closer to the metal supporting board 10 is disposed inwardly. That is, the inner wall surface 22c is inclined so that the opening cross-sectional area of the opening 22 becomes smaller as the portion comes closer to the metal supporting board 10. On the opening end 22b side, the opening 22 has an opening diameter of, for example, 20 to 1000 μm according to the diameter of a via portion 34 to be described later.

The conductive layer 30 is continuously disposed on one surface in the thickness direction D of the insulating layer 20, on the inner wall surfaces 21c, 22c of the openings 21, 22, and on the metal supporting board 10 facing the openings 21, 22. Examples of a material of the conductive layer 30 include copper, nickel, gold, and alloys thereof, and preferably, copper is used. The conductive layer 30 has a thickness of, for example, 3 μm or more, preferably 5 μm or more. The thickness of the conductive layer 30 is, for example, 50 μm or less, preferably 30 μm or less.

The conductive layer 30 includes a terminal portion E, a tail line portion T that extends from the tail line portion E, and a wire (not illustrated) (in FIG. 2, a boundary between the terminal portion E and the tail line portion T is indicated by dashed lines). The wiring circuit board X1 includes at least one terminal portion E with the tail line portion T.

The terminal portion E is a ground terminal, and has the pad portion 31 and the via portion 32 (first via portion).

The pad portion 31 is disposed on the insulating layer 20. Examples of a plan view shape of the pad portion 31 include a circle, a quadrangle, and a rounded quadrangle. The quadrangle includes a square and a rectangle. The rounded quadrangle includes a rounded square and a rounded rectangle (an example in which the plan view shape of the pad portion 31 is a rounded rectangle is illustrated). The pad portion 31 has a length L1 (a length in a longitudinal direction of the pad portion 31) shown in FIG. 1 of, for example, 10 to 600 μm. The pad portion 31 has a width L2 (a length in a direction orthogonal to the longitudinal direction) shown in FIG. 1 of, for example, 10 to 600 μm. The pad portion 31 has an area (an area in plan view shown in FIG. 1) of, for example, 100 to 360000 μm².

The via portion 32 is disposed in the opening 21 of the insulating layer 20 (indicated by dashed lines in FIG. 1). Specifically, the via portion 32 penetrates the insulating layer 20 in the thickness direction D and is connected to the metal supporting board 10. The via portion 32 has a circumferential side surface 32a and an end portion 32b that is connected to the metal supporting board 10. The terminal portion E has a recessed shape in cross section near the portion where the via portion 32 is formed.

In this embodiment, the circumferential side surface 32a is inclined so that a portion thereof closer to the metal supporting board 10 is disposed inwardly. That is, the circumferential side surface 32a is inclined so that the cross-sectional area of the via portion 32 becomes smaller as the portion comes closer to the metal supporting board 10.

The end portion 32b has a diameter R1 (a diameter of the metal supporting board 10-side end of the via portion 32) of preferably 10 μm or more, more preferably 20 μm or more from the viewpoint of reducing the connection resistance of the via portion 32 to the metal supporting board 10. The diameter R1 is preferably 200 μm or less, more preferably 150 μm or less from the viewpoint of securing good connectivity of the terminal portion E (connectivity between the terminal portion E and an external component terminal) by suppressing the size of a recess C in the pad portion 31 surface.

The via portion 32 has a connection area S1 (projected area of the end portion 32b in the thickness direction D) to the metal supporting board 10 of preferably 70 μm² or more, more preferably 150 μm² or more, even more preferably 300 μm² or more from the viewpoint of reducing the connection resistance of the via portion 32 to the metal supporting board 10. The connection area S1 is preferably 40000 μm² less, more preferably 22000 μm² or less from the viewpoint of securing good connectivity of the terminal portion E by suppressing the size of the recess C in the pad portion 31 surface.

In this embodiment, the tail line portion T has a plan view shape that linearly extends in an extending direction from the terminal portion E. The tail line portion T has a length L3 in the extending direction of, for example, 100 to 10000 μm. The length L3 is preferably smaller than the length L1 from the viewpoint of suppressing the size of the tail line portion T in plan view. The smaller the tail line portion T is, the more suitable it is for securing a wiring formable region in the wiring circuit board X1, and is therefore suitable for achieving high-density wiring.

The tail line portion T has a base end portion 33 and a via portion 34 (second via portion).

The base end portion 33 is connected to the terminal portion E. The base end portion 33 has a width L4 in a direction orthogonal to the extending direction of the tail line portion T from the terminal portion E. The width L4 is different from the width L2 of the terminal portion E. The width L4 is preferably smaller than the width L2 from the viewpoints of securing a wiring formable region and of increasing wiring density. The width L4 of the base end portion 33 is, for example, from 50 to 600 μm. A ratio of the width L4 to the width L2 is, for example, 0.08 or more and less than 1.

The via portion 34 is disposed in the opening 22 of the insulating layer 20 (indicated by dashed lines in FIG. 1). Specifically, the via portion 34 penetrates the insulating layer 20 in the thickness direction D and is connected to the metal supporting board 10. The via portion 34 has a circumferential side surface 34*a* and an end portion 34*b* that is connected to the metal supporting board 10. The terminal portion E has a recessed shape in cross section near the portion where the via portion 34 is formed.

In this embodiment, the circumferential side surface 34*a* is inclined so that a portion thereof closer to the metal supporting board 10 is disposed inwardly. That is, the circumferential side surface 34*a* is inclined so that the cross-sectional area of the via portion 34 becomes smaller as the portion comes closer to the metal supporting board 10.

The end portion 34*b* has a diameter R2 (a diameter of the metal supporting board 10-side end of the via portion 34) of preferably 20 μm or more, more preferably 30 μm or more from the viewpoint of reducing the connection resistance of the via portion 34 to the metal supporting board 10. The diameter R2 is preferably 1000 μm or less, more preferably 500 μm or less from the viewpoint of suppressing the size of the tail line portion T in plan view.

The via portion 34 has a connection area S2 (projected area of the end portion 34*b* in the thickness direction D) to the metal supporting board 10 of preferably 300 μm$^2$ or more, more preferably 700 μm$^2$ or more from the viewpoint of reducing the connection resistance of the via portion 34 to the metal supporting board 10. The connection area S2 is preferably 1000000 μm$^2$ less, more preferably 500000 μm$^2$ or less, even more preferably 250000 μm$^2$ or less from the viewpoint of suppressing the size of the tail line portion T. A ratio of the connection area S2 to the connection area S1 is preferably 1.2 or more, more preferably 1.5 or more from the viewpoint of reducing the resistance of electrical connection between the terminal portion E and the metal supporting board 10 while suppressing the enlargement of the diameter of the via portion 32. This ratio is, for example, 1500 or less.

The insulating layer 40 is disposed on one side in the thickness direction D of the insulating layer 20 so as to cover a part of the conductive layer 30. In this embodiment, the insulating layer 40 is disposed so as to cover a part of the tail line portion T, and is disposed so as to cover the portion where the via portion 34 is formed in plan view. The insulating layer 40 has a thickness of, for example. 4 μm or more, preferably 6 μm or more. The thickness of the insulating layer 40 on the insulating layer 20 or on the tail line portion T is, for example, 60 μm or less, preferably 40 μm or less.

FIGS. 3A to 3D represent an example of a method for producing the wiring circuit board X1: FIGS. 3A to 3D represent this producing method as change of the cross-section corresponding to FIG. 2.

Figure 3A:
FIGS. 3A to 3D represent an example of a method for producing the wiring circuit board shown in FIG. 1.

In this producing method, first, as shown in FIG. 3A, the metal supporting board 10 is prepared (preparation step). An adhesion layer (not illustrated) for securing adhesion of the insulating layer 20 to the metal supporting board 10 may be previously formed on one surface (upper surface in the figure) in the thickness direction D of the metal supporting board 10. That is, in this embodiment, the metal supporting board 10 having the adhesion layer on one surface in the thickness direction D may be used.

The adhesion layer is a layer for securing adhesion of the insulating layer 20 to the metal supporting board 10. Examples of the adhesion layer include a film formed by a sputtering method (sputtering film), a film formed by a plating method (plating film), and a film formed by a vacuum deposition method (vacuum deposition film). Examples of a material of the adhesion layer include Cr, Ni, and Ti. The material of the adhesion layer may be an alloy containing two or more metals selected from the group consisting of Cr, Ni, and Ti. For the material of the adhesion layer, preferably, Cr is used. The adhesion layer has a thickness of, for example, 1 nm or more, preferably 10 nm or more, more preferably 20 nm or more. The thickness of the adhesion layer is, for example, 10000 nm or less, preferably 1000 nm or less, more preferably 500 nm or less.

Figure 3B:
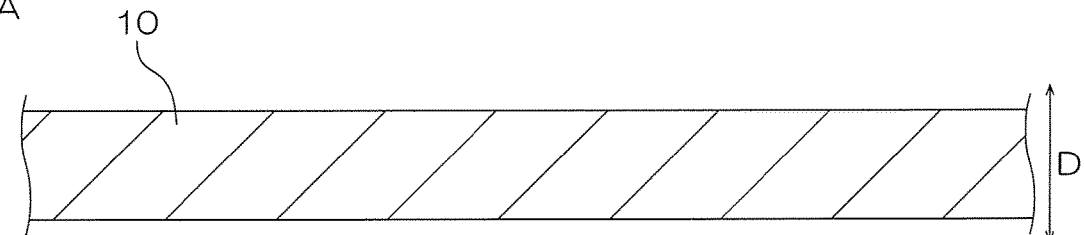

Next, as shown in FIG. 3B, the insulating layer 20 is formed on one surface in the thickness direction D of the metal supporting board 10 (base insulating layer forming step). In this step, the insulating layer 20 is formed, for example, in the following manner. First, a solution (varnish) of a photosensitive resin is applied onto the metal supporting board 10 to form a coated film. Then, this coated film is dried by heating. Then, the dried coated film is subjected to an exposure process through a predetermined mask, and a subsequent development process, and thereafter, subjected to a baking process as required. For example, in the manner described above, the insulating layer 20 having the openings 21, 22 can be formed on the metal supporting board 10. The metal supporting board 10 is exposed in the openings 21, 22.

Figure 3C:
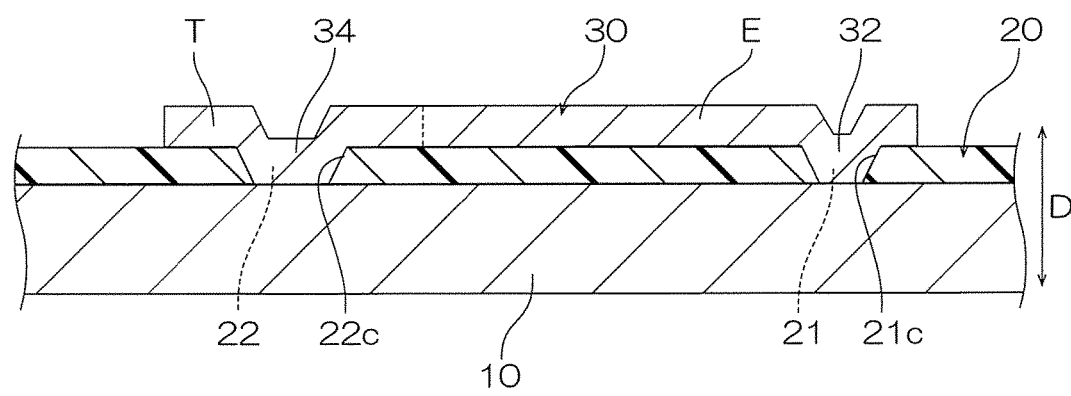

Next, as shown in FIG. 3C, the conductive layer 30 is continuously formed on the insulating layer 20, on the inner wall surfaces 21*c*, 22*c* of the openings 21, 22, and on the metal supporting board 10 exposed in the openings 21, 22 (conductive layer forming step). In this step, first, a seed layer (not illustrated) is formed on the insulating layer 20, on the inner wall surfaces 21*c*, 22*c* of the openings 21, 22, and on the metal supporting board 10 exposed in the openings 21, 22, for example, by a sputtering method. Examples of a material of the seed layer include Cr, Cu, Ni, Ti, and alloys thereof (the same applies to a material of a seed layer to be described later). The seed layer may have a single layer structure or a multilayer structure of two or more layers. When the seed layer has a multilayer structure, the seed layer is formed of, for example, a chromium layer as an underlying layer and a copper layer on the chromium layer. Then, a resist pattern is formed on the seed layer. The resist pattern has an opening having a shape corresponding to the pattern shape of the conductive layer 30. In the formation of the resist pattern, for example, a photosensitive resist film is laminated on the seed layer to form a resist film. Then, this resist film is subjected to an exposure process through a predetermined mask, and a subsequent development process, and thereafter, subjected to a baking process as required (the same applies to the formation of a resist pattern to be described later). In the formation of the conductive layer 30, then, for example, electrolytic plating is performed to grow the above-described metal on the seed layer in the opening of the resist pattern. Then, the resist pattern is removed by etching. Then, in the seed layer, a portion exposed by removing the resist pattern is removed by etching. For example, in the manner described above, the conductive layer 30 (terminal portion E, tail line portion T, wiring) having a predetermined pattern can be formed.

Figure 3D:
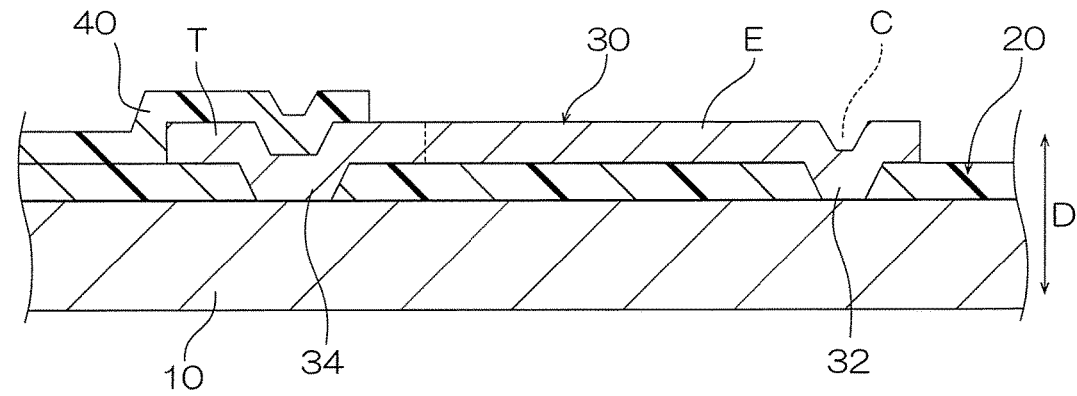

Next, as shown in FIG. 3D, the insulating layer 40 is formed on the insulating layer 20 so as to cover a part of the conductive layer 30 (cover insulating layer forming step). In this step, the insulating layer 40 is formed, for example, in the following manner. First, a solution (varnish) of a photosensitive resin is applied onto the insulating layer 40 and the conductive layer 30 to form a coated film. Then, this coated film is dried. Then, the dried coated film is subjected to an exposure process through a predetermined mask, and a subsequent development process, and thereafter, subjected to a baking process as required. For example, in the manner described above, the insulating layer 40 can be formed.

Then, the metal supporting board 10 is trimmed by a process of etching the metal supporting board 10 as required.

In the manner described above, the wiring circuit board X1 can be produced.

In the wiring circuit board X1, as described above, the terminal portion E has the via portion 32 that is connected to the metal supporting board 10, and the tail line portion T extends from the terminal portion E and has the via portion 34 that is connected to the metal supporting board 10. That is, in the wiring circuit board X1, the terminal portion E having a via-on-pad (VOP) structure, in addition to being electrically connected to the metal supporting board 10 through the via portion 32 inside the VOP structure, is electrically connected to the metal supporting board 10 through the via portion 34 outside the VOP structure. This configuration is suitable for reducing the resistance of the electrical connection between the terminal portion E and the metal supporting board 10 while suppressing the enlargement of the diameters of the via portions 32 and 34. Even though an interface between the metal supporting board 10 and each of the via portions 32, 34 has relatively high resistance, the above-described configuration allows the resistance of the electrical connection between the terminal portion E and the metal supporting board 10 to be easily reduced (for example, supposed that a Cr layer is provided as the above-described adhesion layer and that a Cr film is provided on at least the metal supporting board 10 side of the above-described seed layer These arrangements may cause a relatively high resistance of the interface between the metal supporting board 10 and each of the via portions 32, 34. Even such a case, the above-described configuration allows the resistance of the electrical connection between the terminal portion E and the metal supporting board 10 to be easily reduced).

The above-described configuration, in which the terminal portion E has a VOP structure and is suitable for suppressing the enlargement of the diameter of the via portion 34, is suitable for securing a wiring formable region in the wiring circuit board X1, and is therefore suitable for achieving high-density wiring. The above-described configuration suitable for suppressing the enlargement of the diameter of the via portion 32 is suitable for suppressing the enlargement of the diameter of the recess C in the exposed surface of the terminal portion E, and is therefore suitable for securing good connectivity of the terminal portion E to an external component terminal. The above-described configuration suitable for reducing the resistance of the electrical connection between the terminal portion E and the metal supporting board 10 is suitable for achieving a low-resistance ground connection through the metal supporting board 10 in the terminal portion E.

In the manner described above, the wiring circuit board X1 is suitable for increasing wiring density, and is suitable for achieving good connectivity to an external component terminal and a low-resistance ground connection in the terminal portion E.

In addition, in the wiring circuit board X1, the configuration in which the terminal portion E has the via portion 32 and the tail line portion T has the via portion 34 is preferable from the viewpoint of noise suppression in signal wires when the signal wires are disposed along the terminal portion E and the tail line portion T (this configuration has a higher noise suppression effect than a configuration without the via portion 32 or a configuration without the via portion 34).

Figure 4:
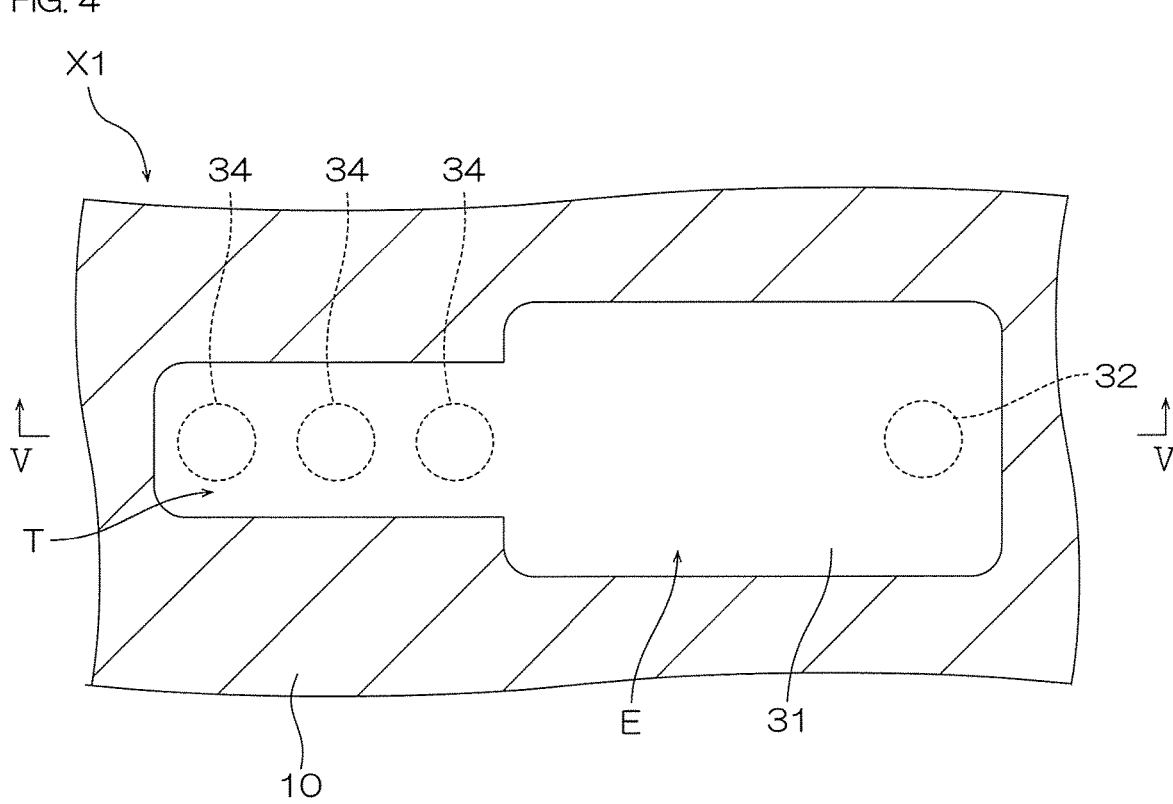
FIG. 4 is a fragmentary plan view of a modification of the wiring circuit board of the first embodiment. In this modification, a tail line portion has a plurality of second via portions.
Figure 5:
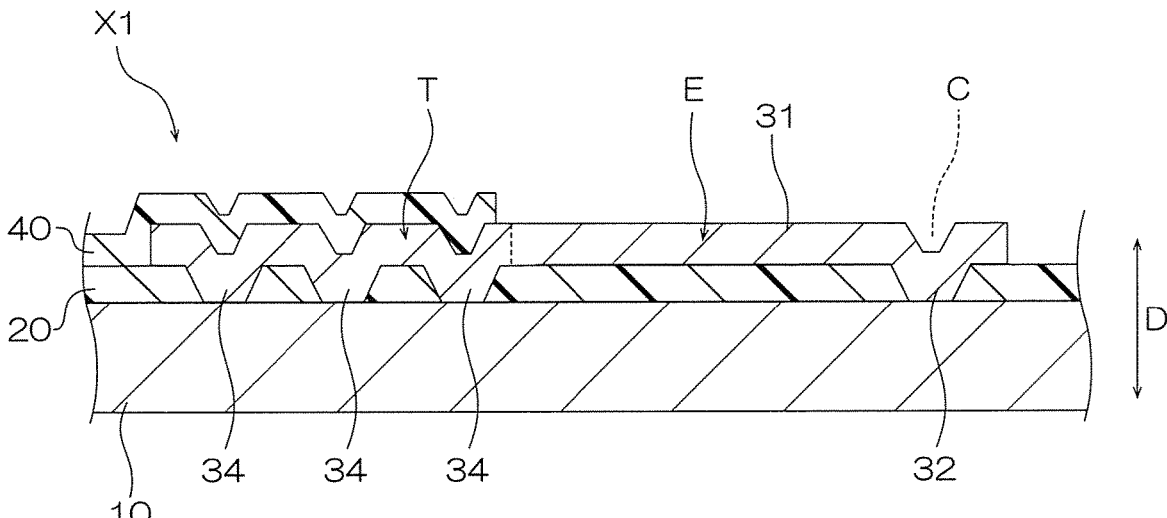
FIG. 5 is a cross sectional view taken along line V-V in FIG. 4.

In the wiring circuit board X1, as shown in FIGS. 4 and 5, the tail line portion T may have a plurality of via portions

34 (an example in which the tail line portion T has three via portions 34 is illustrated). In this modification, the plurality of via portions 34 are aligned in line at intervals from one another in the extending direction of the tail line portion in plan view. The distance between the via portions 34 is, for example, from 35 to 1000 μm.

The configuration in which the tail line portion T has the plurality of via portions 34 is suitable for reducing the resistance of the electrical connection between the terminal portion E and the metal supporting board 10 while suppressing the enlargement of the diameters of the via portions 34. From the viewpoint of such resistance reduction, preferably, the total connection area S2 of the plurality of via portions 34 to the metal supporting board 10 is larger than the connection area 51 of the via portion 32 in the terminal portion E. From the same viewpoint as described above, a ratio of the total connection area S2 of the plurality of via portions 34 to the connection area 51 of the via portion 32 is preferably 1.2 or more, more preferably 1.5 or more. This ratio is, for example, 1500 or less. The suppression of the enlargement of the diameters of the via portion 34 is useful for suppressing the size of the tail line portion T in plan view, and is therefore useful for securing a wiring formable region in the wiring circuit board X1 to achieve high-density wiring.

In this modification, the via portion 32 and the plurality of via portions 34 are aligned in line. This configuration is preferable from the viewpoint of noise suppression in signal wires when the signal wires are disposed along the terminal portion E and the tail line portion T.

Figure 6:
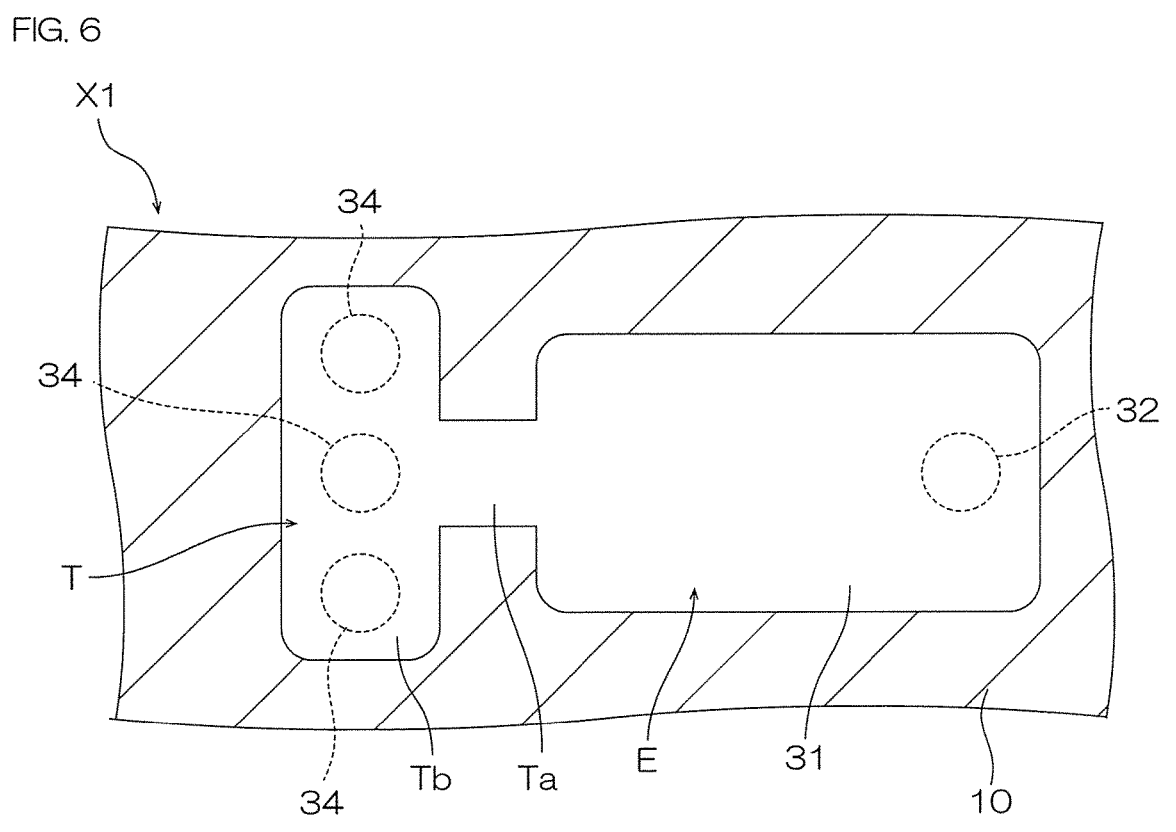

In the wiring circuit board X1, the tail line portion T may have a shape other than the shape that linearly extends from the terminal portion E in plan view. For example, as shown in FIG. 6, the tail line portion T may have a first portion Ta that extends from the terminal portion E, and a second portion Tb that extends in a direction crossing the extending direction of the first portion Ta. The tail line portion T in this modification has a plurality of via portions 34 in the second portion Tb (an example in which the tail line portion T has three via portions 34 is illustrated). The tail line portion T is formed into a shape corresponding to the wiring layout around the terminal portion E.

Figure 7:
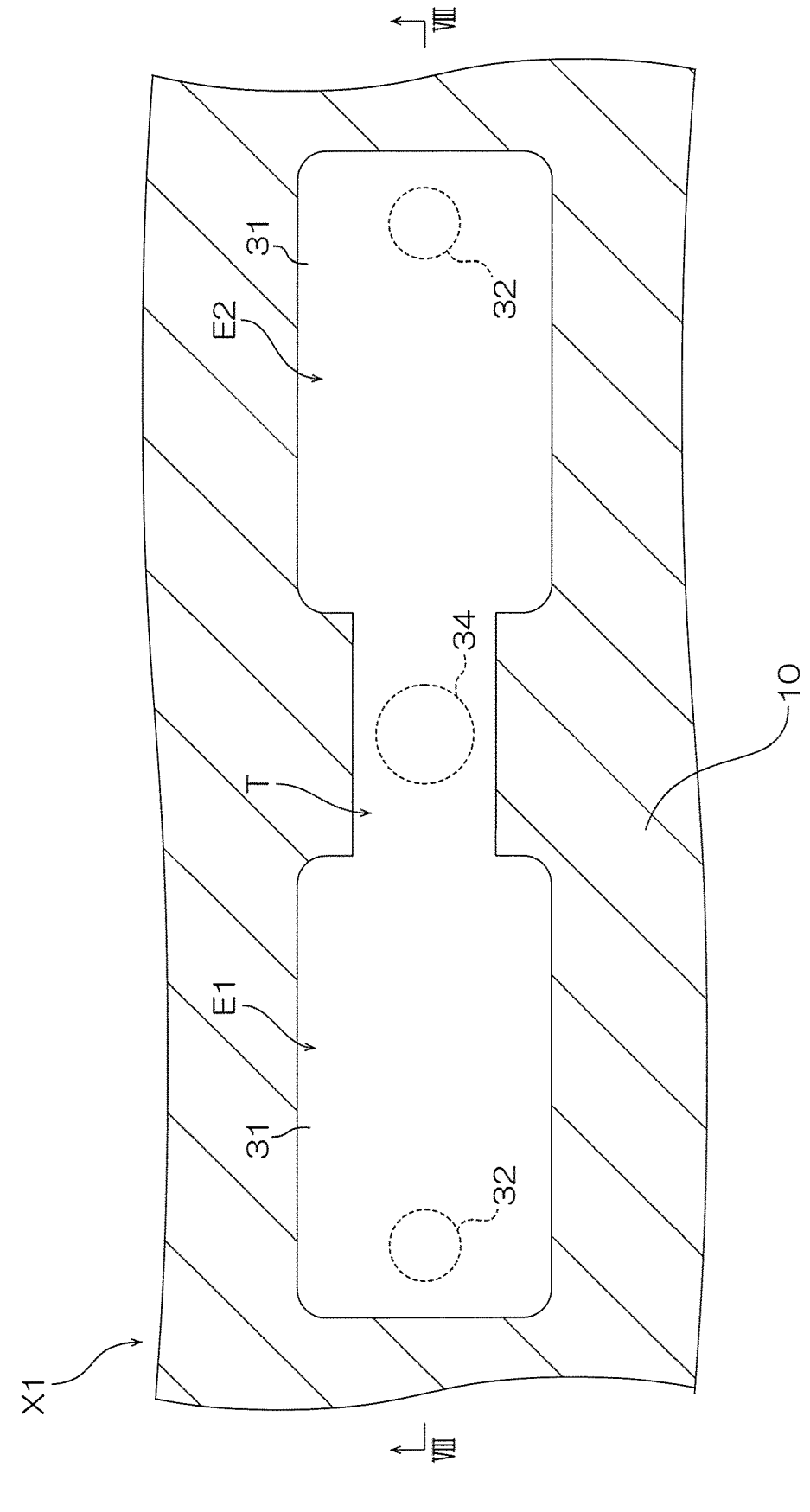
FIG. 7 is a fragmentary plan view of another modification of the wiring circuit board of the first embodiment. In this modification, the wiring circuit board has two terminal portions that are joined by a tail line portion.
Figure 8:
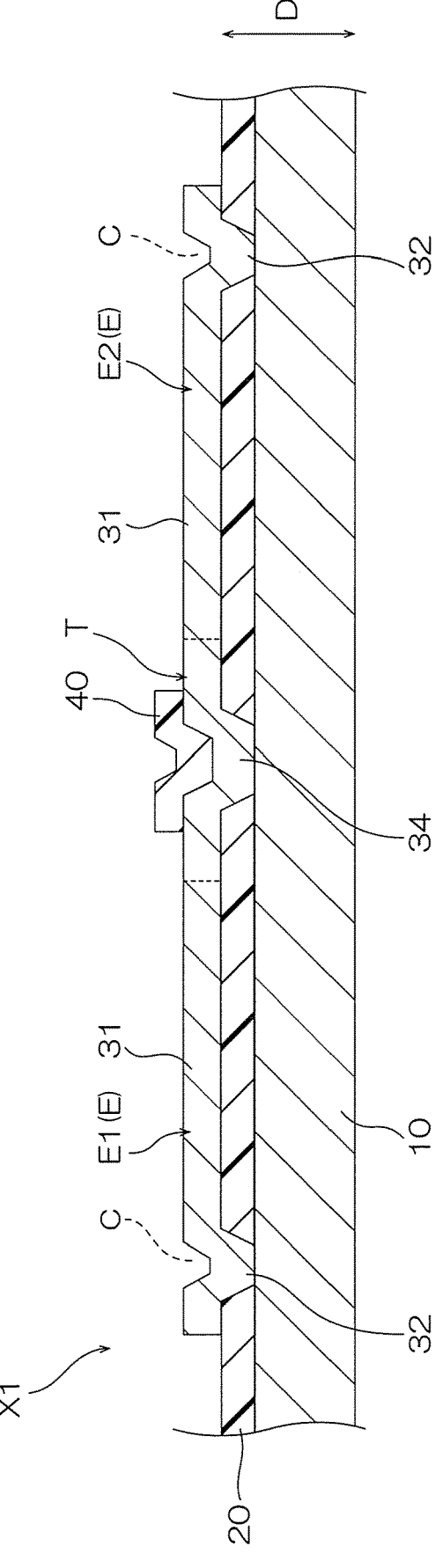
FIG. 8 is a cross sectional view taken along line VIII-VIII in FIG. 7.

In the wiring circuit board X1, as shown in FIGS. 7 and 8, the conductive layer 30 may include two terminal portions E (terminal portions E1 and E2) that are joined by the tail line portion T. In this modification, the tail line portion T extends from one terminal portion E1 to the other terminal portion E2. That is, the tail line portion T that extends from the terminal portion E is shared with the terminal portions E1 and E2. This configuration is suitable for securing a wiring formable region in the wiring circuit board X1, and is therefore suitable for achieving high-density wiring.

Figure 9A:
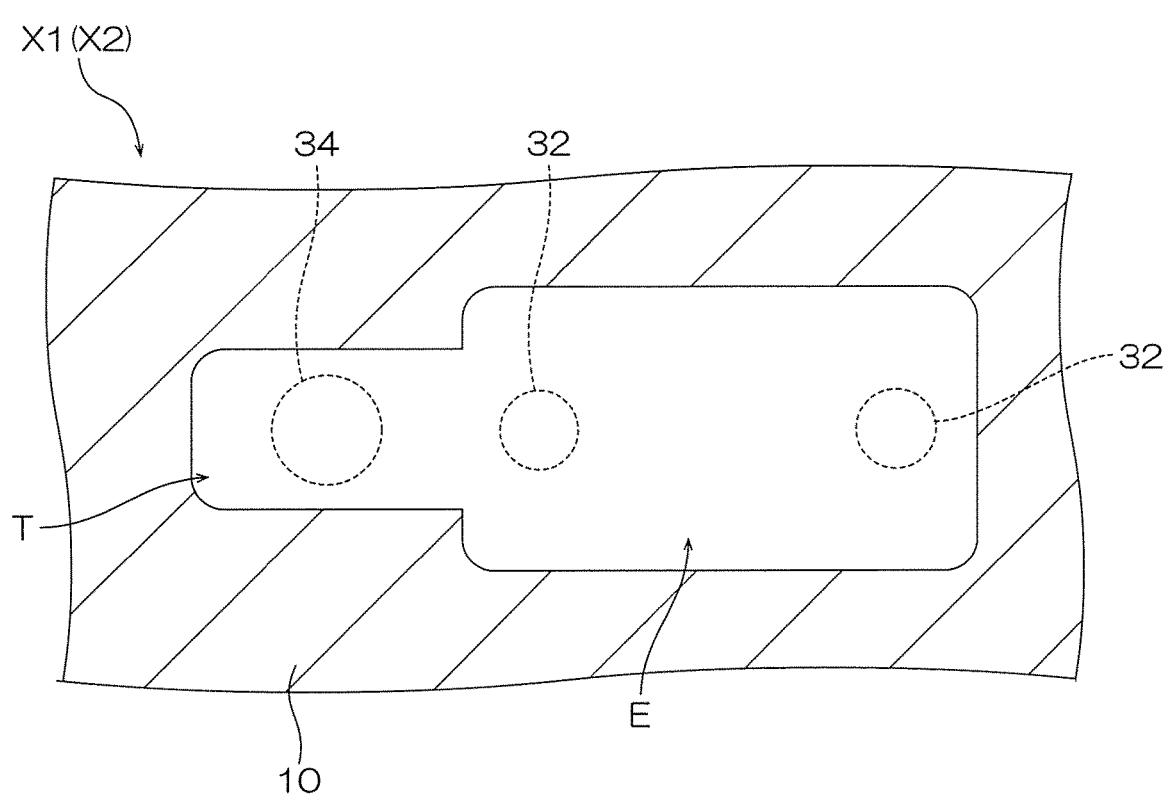
FIGS. 9A and 9B represent a variation of the case where the terminal portion has a plurality of first via portions: In the modification shown in FIG. 9A, the terminal portion has a plurality of first via portions that are aligned in line with the second via portion of the tail line portion. In the modification shown in FIG. 9B, the terminal portion has a first via portion at each of four corners in plan view.
Figure 9B:
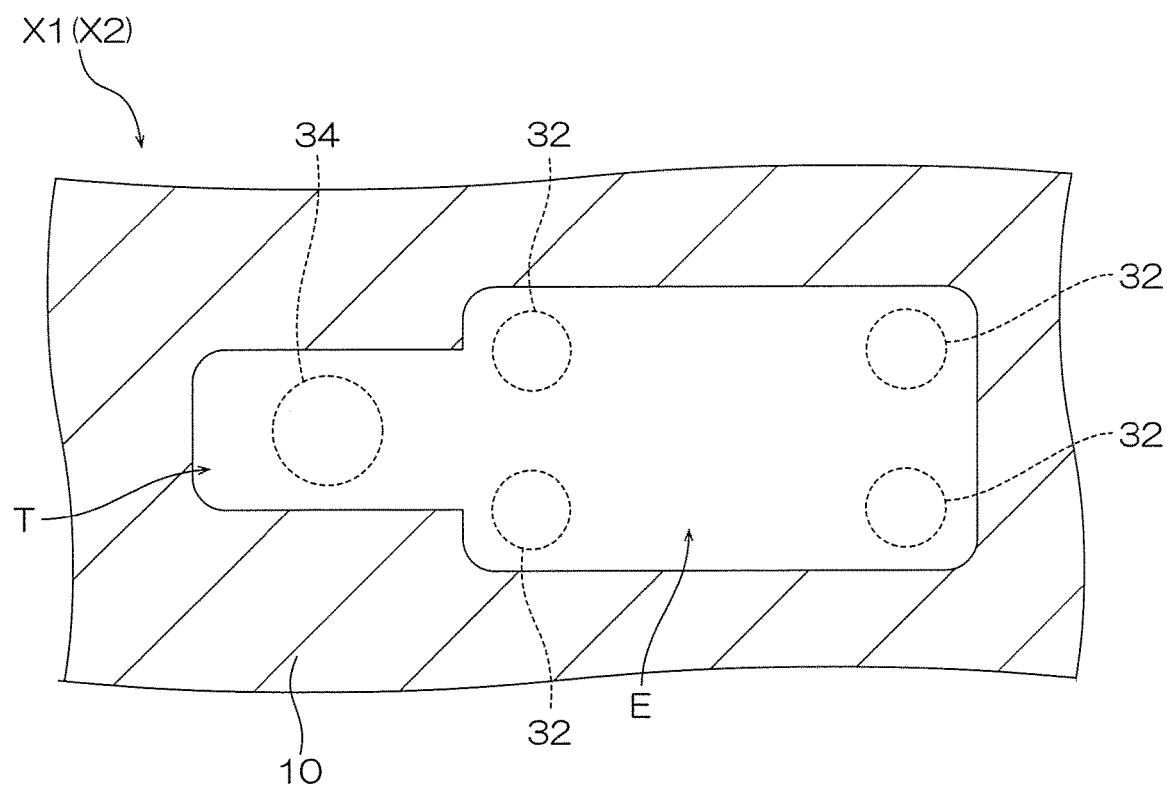

In the wiring circuit board X1, as shown in FIGS. 9A and 9B, the terminal portion E may have a plurality of via portions 32.

In the modification shown in FIG. 9A, the terminal portion E has a plurality of via portions 32 aligned in line, in addition to the via portion 34 of the tail line portion T (FIG. 9A illustrates an example in which the terminal portion E has two via portions 32). This configuration is preferable from the viewpoint of noise suppression in signal wires when the signal wires are disposed along the terminal portion E and the tail line portion T.

In the modification shown in FIG. 9B, the terminal portion E has the via portion 32 at each of four corners in plan view. This configuration is preferable from the viewpoint of resistance reduction in electrical connection through the via portion 32 between the terminal portion E and the metal supporting board 10.

Figure 10:
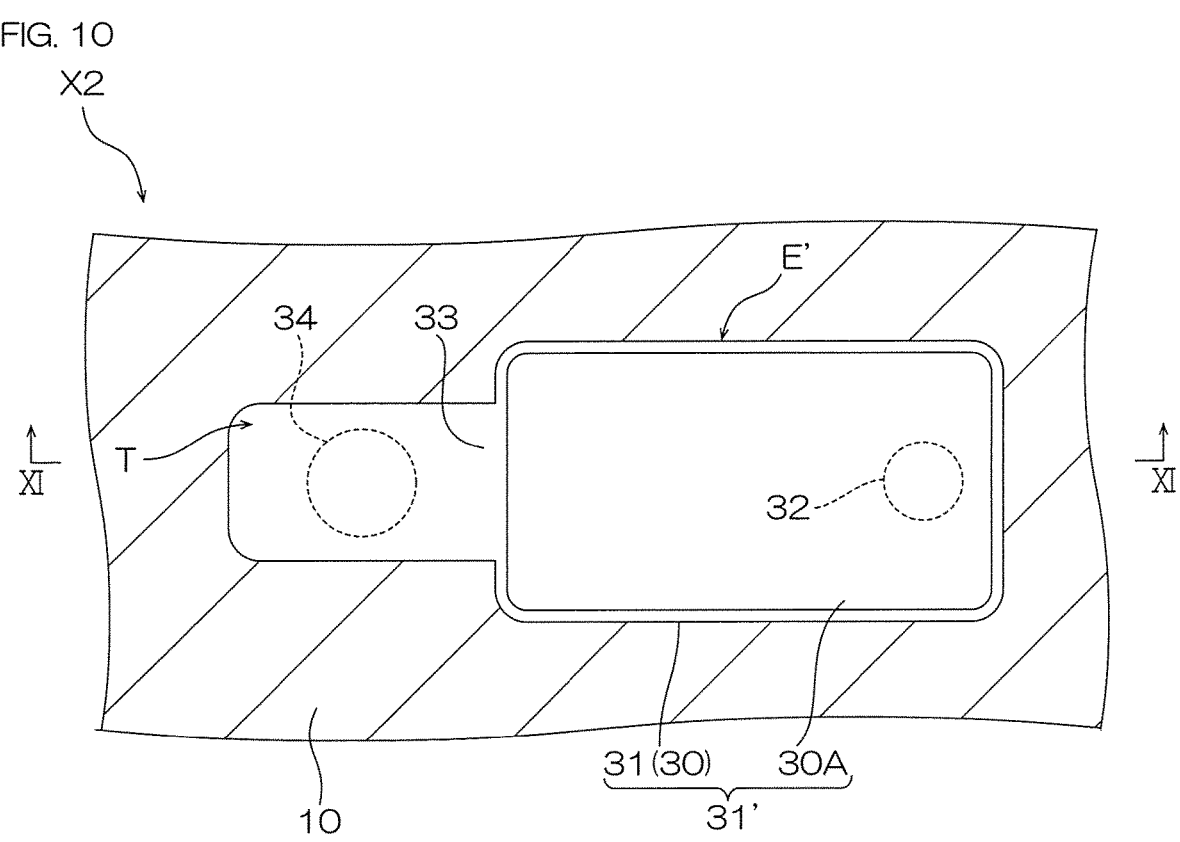
FIG. 10 is a fragmentary plan view of a second embodiment of the wiring circuit board of the present invention.
Figure 11:
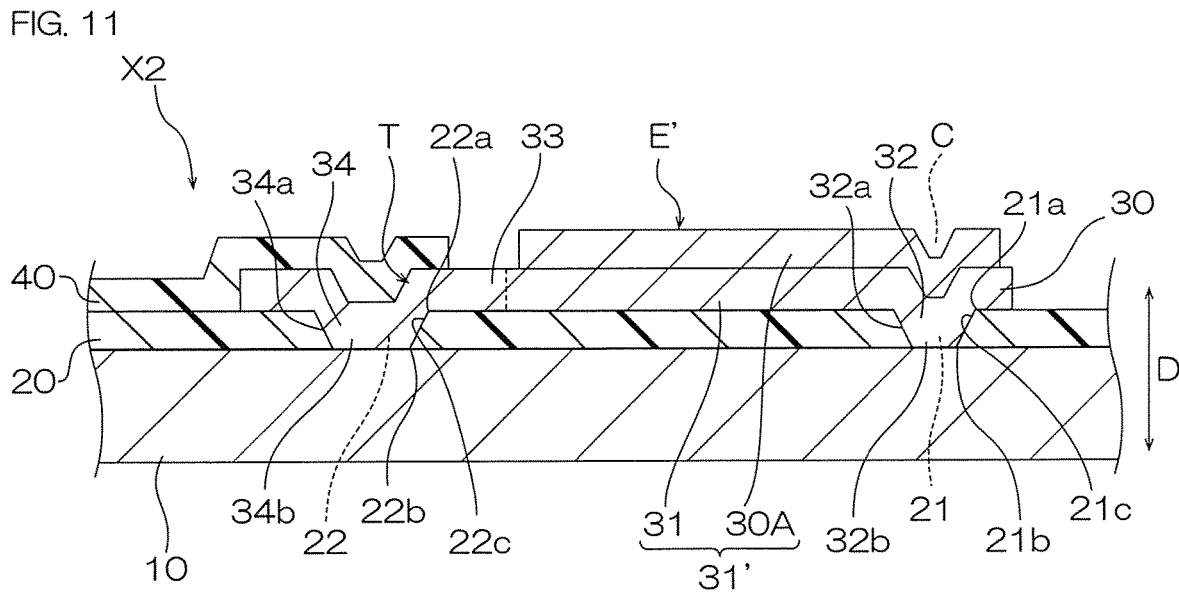
FIG. 11 is a cross sectional view taken along line XI-XI in FIG. 10.

FIGS. 10 and 11 show a wiring circuit board X2 as a second embodiment of the wiring circuit board of the present invention Like the wiring circuit board X1, the wiring circuit board X2 includes the metal supporting board 10, the insulating layer 20 as a base insulating layer, the conductive layer 30, and the insulating layer 40 (not illustrated in FIG. 10) as a cover insulating layer in this order toward one side in the thickness direction D. The wiring circuit board X2 is different from the wiring circuit board X1 in that it further includes the conductive layer 30A on a part of the conductive layer 30 and has a terminal portion E' instead of the terminal portion E. Except this, the wiring circuit board X2 has the same configuration as the wiring circuit board X1.

The terminal portion E' includes the conductive layer 30 (first conductive layer) on the insulating layer 20 side, and the conductive layer 30A (second conductive layer) on the conductive layer 30, and has a two-layer structure of the conductive layers 30, 30A. The terminal portion E' has a pad portion 31' and the via portion 32 (first via portion). The terminal portion E' is different from the terminal portion E in that it has the pad portion 31' instead of the pad portion 31.

The pad portion 31' includes the above-described pad portion 31 and the conductive layer 30A on this pad portion 31. The conductive layer 30A has a contour fitted into the contour of the pad portion 31 in plan view. Examples of the plan view shape of the conductive layer 30A includes the above-described shape as the plan view shape of the pad portion 31 (an example in which the plan view shapes of the pad portion 31 and the conductive layer 30A are rounded rectangles is illustrated). For a material of the conductive layer 30A, the above-described materials of the conductive layer 30 are used. The material of the conductive layer 30 and the material of the conductive layer 30A are preferably the same, more preferably copper. The materials of the conductive layers 30, 30A may be different. The conductive layer 30A has a thickness of, for example, 3 μm or more, preferably 5 μm or more, and for example, 50 μm or less, preferably 30 μm or less.

It is preferable for the pad portion 31' to have such a two-layer structure from the viewpoint of securing the strength of the pad portion 31'. It is also preferable for the pad portion 31' to have the two-layer structure from the viewpoint of securing good connectivity of the terminal portion E' by suppressing the size of the recess C of the pad portion 31' surface.

In the wiring circuit board X2, the tail line portion T extends from this terminal portion E'. The wiring circuit board X2 includes at least one terminal portion E' with the tail line portion T.

Figure 12A:
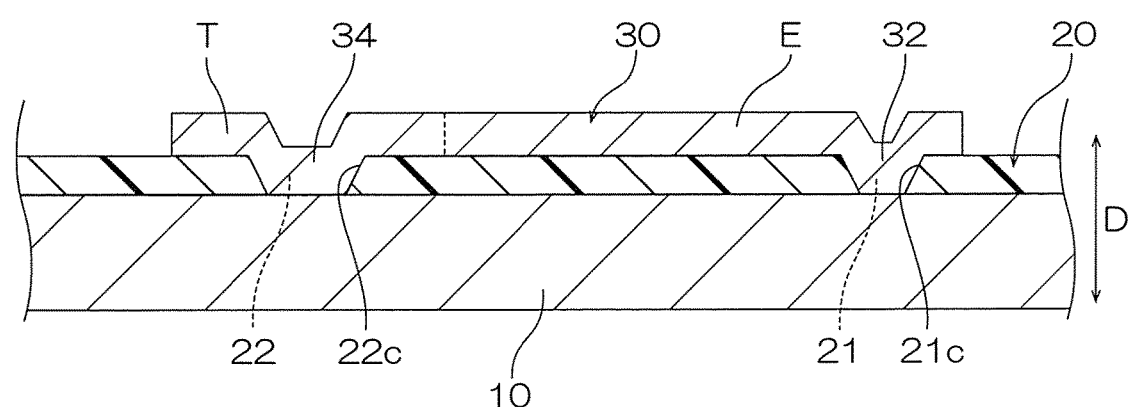
FIGS. 12A to 12C represent a part of the steps in a method for producing the wiring circuit board shown in FIG. 10.
Figure 12B:
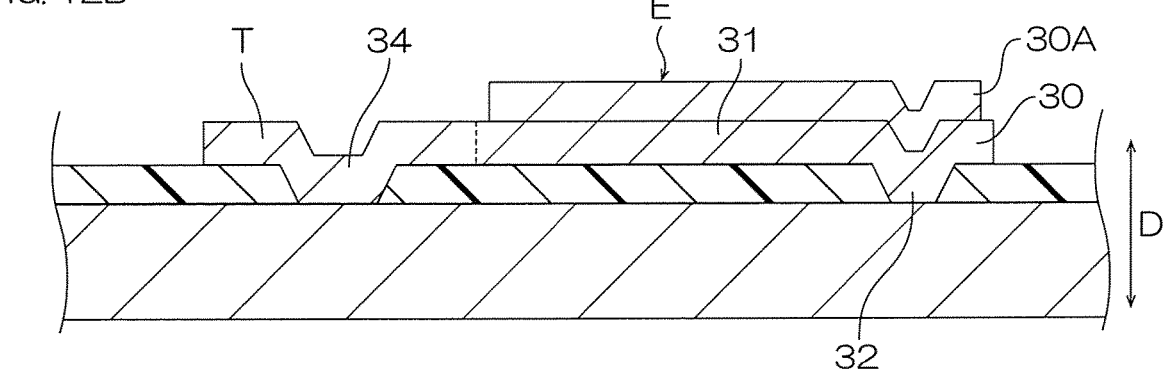
Figure 12C:
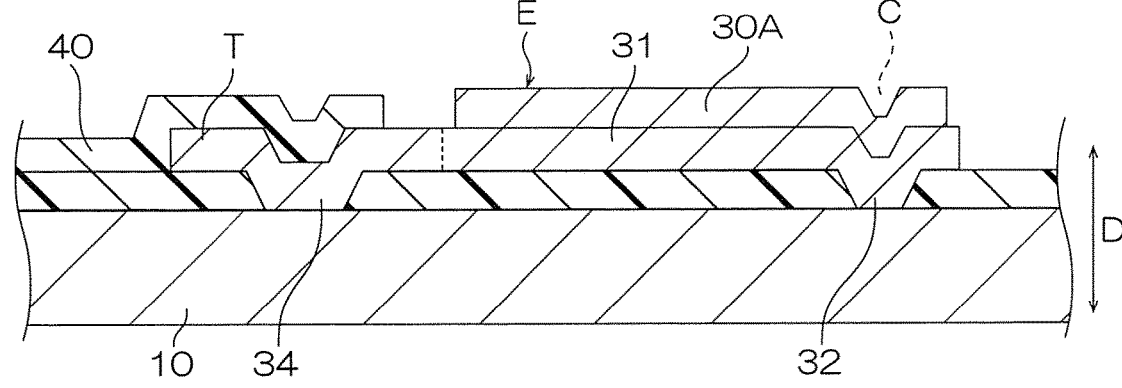
Figure 13:
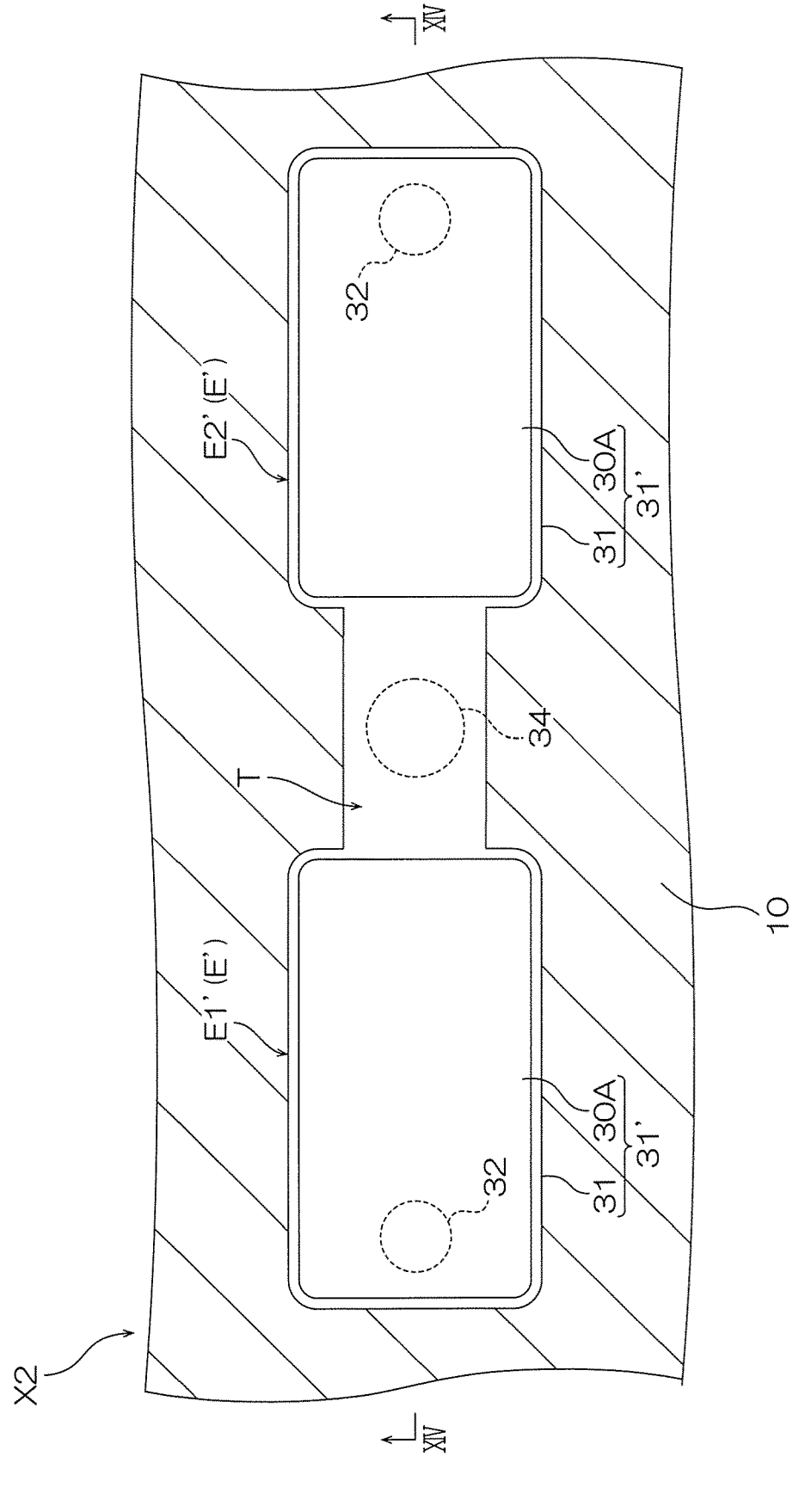
FIG. 13 is a fragmentary plan view of a modification of the wiring circuit board of the second embodiment. In this modification, two terminal portions that are joined by the tail line portion are provided.
Figure 14:
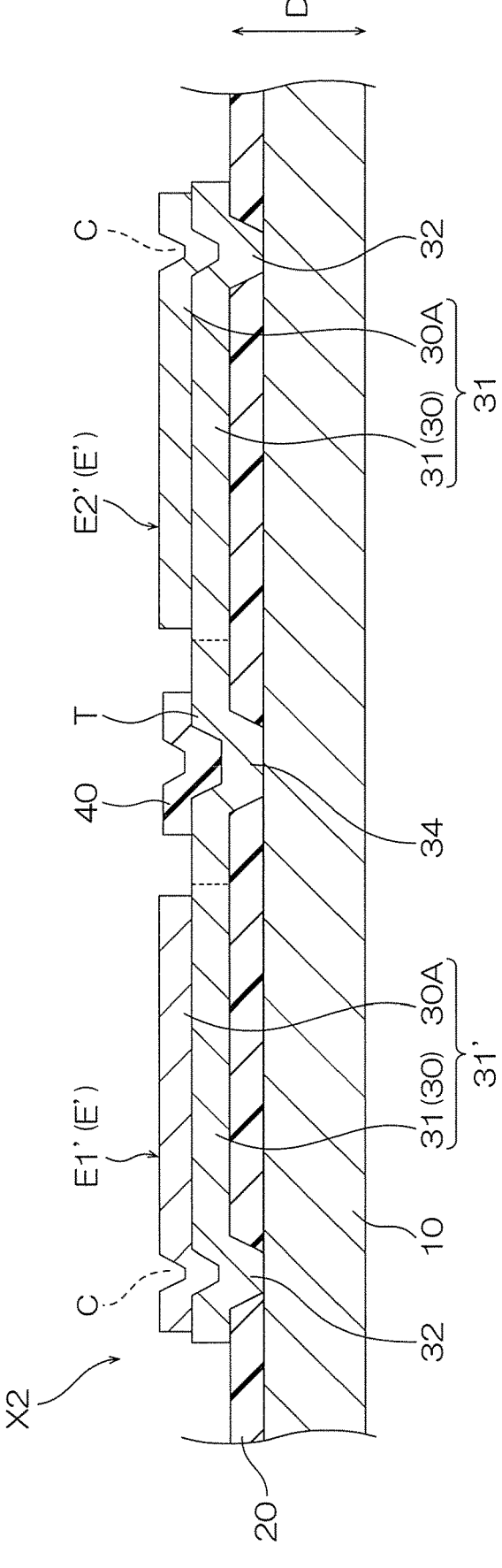
FIG. 14 is a cross sectional view taken along line XIV-XIV in FIG. 13.
Figure 15:
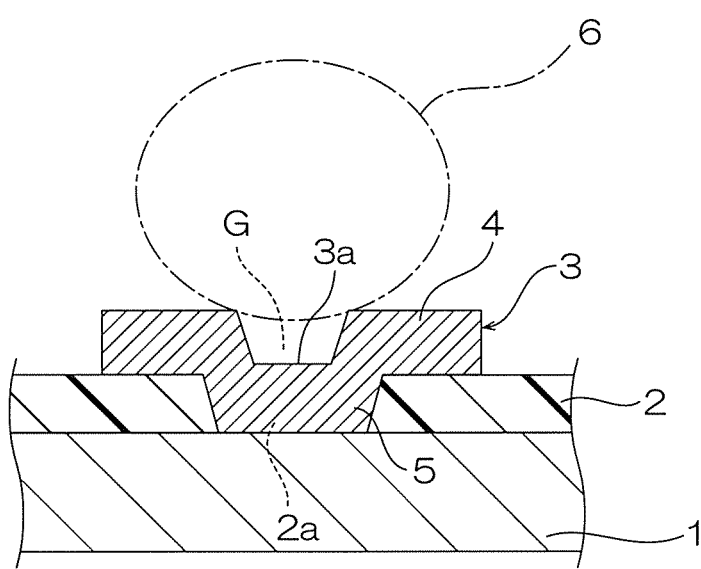
FIG. 15 is a fragmentary sectional view of a conventional wiring circuit board.

FIGS. 12A to 12C represent an example of a method for producing the wiring circuit board X2: FIGS. 12A to 12C represent this producing method as change of the cross-section corresponding to FIG. 11.

In this producing method, first, in the same manner as described above with reference to FIGS. 3A and 3B, the preparation step and the base insulating layer forming step are performed.

Next, as shown in FIG. 12A, the conductive layer 30 is patterned on the insulating layer 20 (first conductive layer forming step). Specifically, this step is the same as described above with reference to FIG. 3C.

Next, as shown in FIG. 12B, the conductive layer 30A is formed on the conductive layer 30 (second conductive layer forming step). In this step, first, a seed layer (not illustrated) is formed so as to cover the insulating layer 20 and the conductive layers 30, 30A, for example, by a sputtering method. Then, a resist pattern is formed on the seed layer. The resist pattern has an opening having a shape corresponding to the pattern shape of the conductive layer 30A. Then, electrolytic plating is performed to grow the above-described metal on the seed layer in the opening of the resist pattern. Then, the resist pattern is removed by etching. Then, in the seed layer, a portion exposed by removing the resist pattern is removed by etching. For example, in the manner described above, the conductive layer 30A can be formed on the conductive layer 30.

Next, as shown in FIG. 12C, the insulating layer 40 is formed on the insulating layer 20 so as to cover a part of the conductive layer 30 (cover insulating layer forming step). Specifically, this step is the same as described above with reference to FIG. 3D.

Then, the metal supporting board 10 is trimmed by a process of etching the metal supporting board 10 as required.

In the manner described above, the wiring circuit board X2 can be produced.

In the wiring circuit board X2, the terminal portion E' has the via portion 32 that is connected to the metal supporting board 10, and the tail line portion T extends from the terminal portion EE' and has the via portion 34 that is connected to the metal supporting board 10. That is, in the wiring circuit board X2, the terminal portion E' having a VOP structure, in addition to being electrically connected to the metal supporting board 10 through the via portion 32 inside the VOP structure, is electrically connected to the metal supporting board 10 through the via portion 34 outside the VOP structure. This configuration is suitable for resistance reduction in electrical connection between the terminal portion E' and the metal supporting board 10 while suppressing the enlargement of the diameters of the via portions 32 and 34. Therefore, like the wiring circuit board X1, the wiring circuit board X2 is suitable for increasing wiring density, and is suitable for achieving good connectivity to an external component terminal and a low-resistance ground connection in the terminal portion.

In addition, in the wiring circuit board X2, the configuration in which the terminal portion E has the via portion 32 and the tail line portion T has the via portion 34 is preferable from the viewpoint of noise suppression in signal wires when the signal wires are disposed along the terminal portion E and the tail line portion T (this configuration has a higher noise suppression effect than a configuration without the via portion 32 or a configuration without the via portion 34).

In the wiring circuit board X2, as described above with reference to FIGS. 4 and 5 for the wiring circuit board X1, the tail line portion T may have a plurality of via portions 34. The plurality of via portions 34 are, for example, aligned in line.

In the wiring circuit board X2, the tail line portion T may have a shape other than the shape that linearly extends from the terminal portion E' in plan view. For example, as described above with reference to FIG. 6 for the wiring circuit board X1, the tail line portion T may have a first portion Ta that extends from the terminal portion E', and a second portion Tb that extends in a direction crossing the extending direction of the first portion Ta.

In the wiring circuit board X2, as described above with reference to FIGS. 7 and 8 for the wiring circuit board X1, two terminal portions E' (terminal portions E1' and E2') that are joined by the tail line portion T may be provided.

In the wiring circuit board X2, as described above with reference to FIGS. 9A and 9B for the wiring circuit board X1, the terminal portion E' may have a plurality of via portions 32.

Technical advantages in these modifications are as described above for the wiring circuit board X1.

The aforedescribed embodiments are illustrative of the present invention and should not be construed as being limited to the embodiments. Modification and variation of the present invention that will be obvious to those skilled in the art is to be covered by the following claims.

INDUSTRIAL APPLICABILITY

The wiring circuit board of the present invention is applicable to a wiring circuit board including a metal supporting board as a supporting substrate.

DESCRIPTION OF REFERENCE NUMERALS

X1, X2 wiring circuit boards
D thickness direction
10 metal supporting board
20, 40 insulating layer
30, 30A conductive layer
E, E' terminal portions
T tail line portion
31, 31' pad portions
32 via portion (first via portion)
33 base end portion
34 via portion (second via portion)

The invention claimed is:

1. A wiring circuit board comprising:
a metal supporting board; an insulating layer; and a conductive layer in this order in a thickness direction,
wherein the conductive layer includes a terminal portion, and a tail line portion extending from the terminal portion,
   the terminal portion having a first via portion that penetrates the insulating layer in the thickness direction and is connected to the metal supporting board,
   the tail line portion having a base end portion and a second via portion, the base end portion having a width different from a width of the terminal portion in a direction orthogonal to the extending direction of the tail line portion, the base end portion being connected to the terminal portion, the second via portion penetrating the insulating layer in the thickness direction and being connected to the metal supporting board,
a connection area of the second via portion to the metal supporting board is larger than a connection area of the first via portion to the metal supporting board, and
a ratio of the connection area of the second via portion to the metal supporting board with respect to the connection area of the first via portion to the metal supporting board is 1.2 or more.

2. The wiring circuit board according to claim 1, wherein the tail line portion has a plurality of the second via portions.

3. The wiring circuit board according to claim 2, wherein a total connection area of the plurality of second via portions to the metal supporting board is larger than a connection area of the first via hole to the metal supporting board.

4. The wiring circuit board according to claim 1, wherein the terminal portion includes a first conductive layer on a side of the insulating layer, and a second conductive layer on the first conductive layer.

5. The wiring circuit board according to claim 1, wherein the conductive layer includes two terminal portions, and the tail line portion extends from one terminal portion to the other terminal portion.

6. A wiring circuit board comprising:
a metal supporting board; an insulating layer; and a conductive layer in this order in a thickness direction,
wherein the conductive layer includes a terminal portion, and a tail line portion extending from the terminal portion,
   the terminal portion having a first via portion that penetrates the insulating layer in the thickness direction and is connected to the metal supporting board,
   the tail line portion having a base end portion and a second via portion, the base end portion having a width different from a width of the terminal portion in a direction orthogonal to the extending direction of the tail line portion, the base end portion being connected to the terminal portion, the second via portion penetrating the insulating layer in the thickness direction and being connected to the metal supporting board, and
the conductive layer includes two terminal portions, and the tail line portion extends from one terminal portion to the other terminal portion.

7. A wiring circuit board comprising:
a metal supporting board; an insulating layer; and a conductive layer in this order in a thickness direction,
wherein the conductive layer includes a terminal portion, and a tail line portion extending from the terminal portion,
   the terminal portion having a first via portion that penetrates the insulating layer in the thickness direction and is connected to the metal supporting board,
   the tail line portion having a base end portion and a second via portion, the base end portion having a width different from a width of the terminal portion in a direction orthogonal to the extending direction of the tail line portion, the base end portion being connected to the terminal portion, the second via portion penetrating the insulating layer in the thickness direction and being connected to the metal supporting board,
the terminal portion includes a first conductive layer on a side of the insulating layer, and a second conductive layer on the first conductive layer, and
the material of the first conductive layer and the material of the second conductive layer are the same.

* * * * *